United States Patent
Wang et al.

(10) Patent No.: US 11,853,092 B2
(45) Date of Patent: Dec. 26, 2023

(54) LOW DROPOUT REGULATOR AND RELATED METHOD

(71) Applicant: TAIWAN SEMICONDUCTOR MANUFACTURING CO., LTD., Hsinchu (TW)

(72) Inventors: Yi-Hsiang Wang, New Taipei (TW); Jaw-Juinn Horng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/165,265

(22) Filed: Feb. 6, 2023

(65) Prior Publication Data
US 2023/0185323 A1  Jun. 15, 2023

Related U.S. Application Data

(63) Continuation of application No. 16/886,556, filed on May 28, 2020, now Pat. No. 11,573,585.

(51) Int. Cl.
| | | |
|---|---|---|
| G05F 1/575 | (2006.01) | |
| G05F 1/59 | (2006.01) | |
| H03F 3/45 | (2006.01) | |

(52) U.S. Cl.
CPC ............... *G05F 1/575* (2013.01); *G05F 1/59* (2013.01); *H03F 3/45273* (2013.01)

(58) Field of Classification Search
CPC .......... G05F 1/462; G05F 1/465; G05F 1/468; G05F 1/56; G05F 1/575; G05F 1/562;
(Continued)

(56) References Cited

U.S. PATENT DOCUMENTS

| | | |
|---|---|---|
| 6,750,638 B1 | 6/2004 | Gang |
| 7,106,233 B2 | 9/2006 | Schroeder |
| | (Continued) | |

FOREIGN PATENT DOCUMENTS

EP        1947544 A1 *  7/2008  ............ G05F 1/565

OTHER PUBLICATIONS

Yan Lu et. al., "A 0.65ns-Response-Time 3.01ps FOM Fully-Integrated Low-Dropout Regulator with Full-Spectrum Power-Supply-Rejection for Wideband Communication Systems", 2014 IEEE International Solid-State Circuits Conference Digest of Technical Papers (ISSCC), 2014, pp. 306-307.

(Continued)

*Primary Examiner* — Kevin J Comber
*Assistant Examiner* — Nusrat Quddus
(74) *Attorney, Agent, or Firm* — Maschoff Brennan

(57) ABSTRACT

A device is provided. The device includes an operational amplifier, an output circuit, a first capacitor, and a second capacitor. The operational amplifier is configured to generate an output according to a feedback signal. The output circuit is configured to generate a first current signal in response to a supply voltage and the output of the operational amplifier. The first current signal includes a first ripple signal. The first capacitor and the second capacitor are coupled in parallel between the operational amplifier and the output circuit. The first capacitor is configured to receive the first current signal and feedback to the operational amplifier the first ripple signal.

20 Claims, 8 Drawing Sheets

(58) Field of Classification Search
CPC .......... G05F 1/565; G05F 1/567; G05F 1/569; G05F 1/571; G05F 1/573; G05F 1/5735
See application file for complete search history.

(56) References Cited

U.S. PATENT DOCUMENTS

| | | | |
|---|---|---|---|
| 8,143,868 B2* | 3/2012 | Dasgupta | G05F 1/56 |
| | | | 323/273 |
| 8,169,203 B1 | 5/2012 | Vemula | |
| 10,013,005 B1 | 7/2018 | Ippili | |
| 10,416,695 B1 | 9/2019 | Bohannon | |
| 10,591,938 B1 | 3/2020 | Golara | |
| 10,768,650 B1 | 9/2020 | Huang | |
| 10,831,221 B1 | 11/2020 | Tesch | |
| 11,036,242 B2 | 6/2021 | Hoke | |
| 11,656,643 B2* | 5/2023 | Delshadpour | G05F 1/461 |
| | | | 323/280 |
| 2008/0001585 A1 | 1/2008 | Bakkaloglu | |
| 2008/0088286 A1* | 4/2008 | Cho | G05F 1/56 |
| | | | 323/280 |
| 2009/0001953 A1 | 1/2009 | Juang | |
| 2010/0066320 A1 | 3/2010 | Dasgupta | |
| 2011/0156674 A1 | 6/2011 | Lin | |
| 2013/0271100 A1 | 10/2013 | El-Nozahi | |
| 2014/0239929 A1 | 8/2014 | Fiocchi | |
| 2014/0253067 A1* | 9/2014 | Navas | G05F 1/575 |
| | | | 323/273 |
| 2014/0340058 A1 | 11/2014 | Wang | |
| 2017/0315574 A1 | 11/2017 | Brown | |
| 2018/0173260 A1 | 6/2018 | Zou | |

OTHER PUBLICATIONS

Jianping Guo et al., "A 6-micro W Chip-Area-Efficient Output-Capacitorless LDO in 90-nm CMOS Technology", IEEE Journal of Solid-State Circuits, vol. 45, No. 9, Sep. 2010, pp. 1896-1905.

John F. Bulzacchelli et al., "Dual-Loop System of Distributed Microregulators With High DC Accuracy, Load Response Time Below 500 ps, and 85-mV Dropout Voltage", IEEE Journal of Solid-State Circuits, vol. 47, No. 4, Apr. 2012, pp. 863-874.

* cited by examiner

LOW DROPOUT REGULATOR AND RELATED METHOD

CROSS REFERENCE

This application is a continuation of U.S. application Ser. No. 16/886,556, filed on May 28, 2020, now U.S. Pat. No. 11,573,585, issued on Feb. 7, 2023, which is herein incorporated by reference.

BACKGROUND

A power supply is able to provide a stable signal without noise to subsequent circuits. Generally, a voltage regulator is coupled between the power supply and the subsequent circuits, for providing the stable signal within a specific voltage range. For an electronic device integrated on chips, a low dropout (LDO) voltage regulator is provided, and is configured to regularly output small dropout voltages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
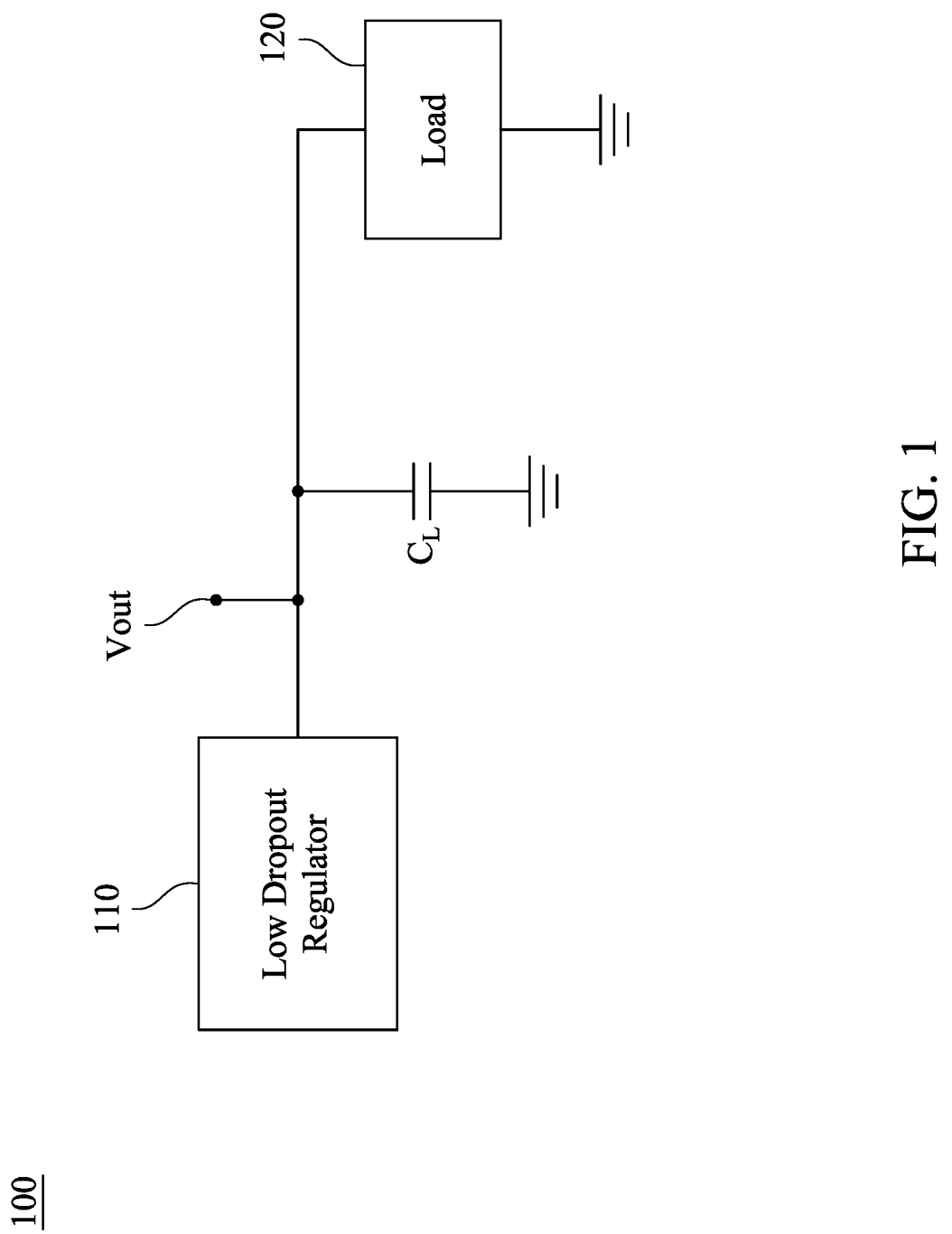
FIG. 1 is a schematic diagram of a circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled", and the term "connected" may be termed as "electrically connected". "Coupled" and "connected" may also be used to indicate that two or more elements cooperate or interact with each other.

Furthermore, spatially relative terms, such as "underlying," "below," "lower," "overlying," "upper" and the like, may be used throughout the description for ease of understanding to describe one element or feature's relationship to another element(s) or feature(s) as illustrated in the figures. The spatially relative terms are intended to encompass different orientations of the device in use or operation in addition to the orientation depicted in the figures. The structure may be otherwise oriented (e.g., rotated 90 degrees or at other orientations) and the spatially relative descriptors used herein may likewise be interpreted accordingly.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

A low dropout (LDO) regulator therein is provided in accordance with various embodiments. Some variations of some embodiments are discussed. Throughout various views and illustrative embodiments, like elements are designated with the like reference numbers for ease of understanding.

Reference is now made to FIG. 1. FIG. 1 is a schematic diagram of a circuit 100, in accordance with some embodiments of the present disclosure. In some embodiments, the circuit 100 is implemented by a chip, which is also indicated as an integrated circuit (IC). Various circuits which require implementation of the circuit are within the contemplated scope of the present disclosure.

For illustration in FIG. 1, the circuit 100 includes a low dropout (LDO) regulator 110, a capacitor $C_L$, and a load 120. The LDO regulator 110 is sequentially followed by the capacitor $C_L$, and the load 120.

Figure 3:
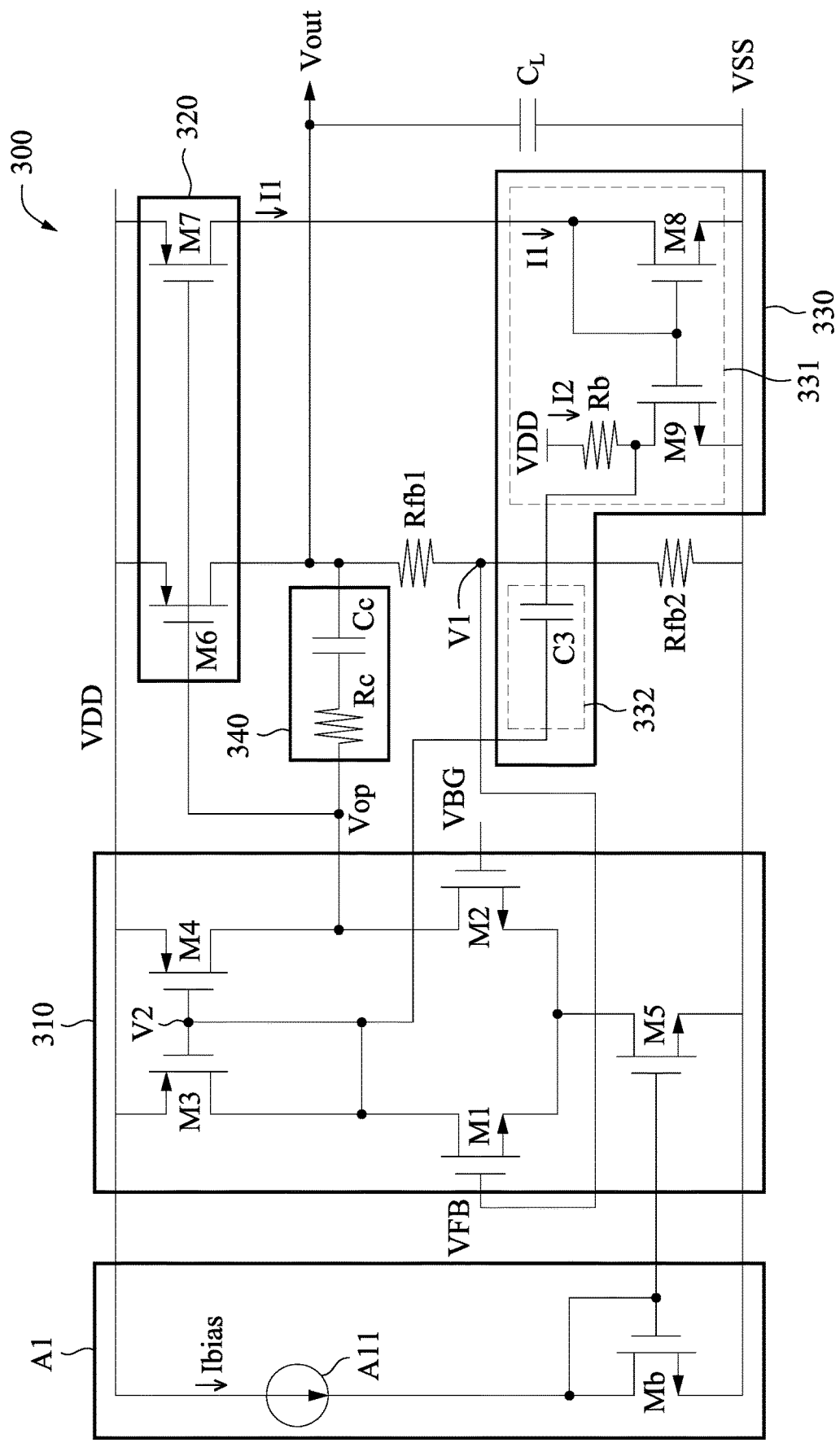
FIG. 3 is a circuit diagram of a low dropout (LDO) regulator corresponding to the LDO regulators shown in FIG. 1 or FIG. 2, in accordance with some embodiments of the present disclosure.
Figure 5:
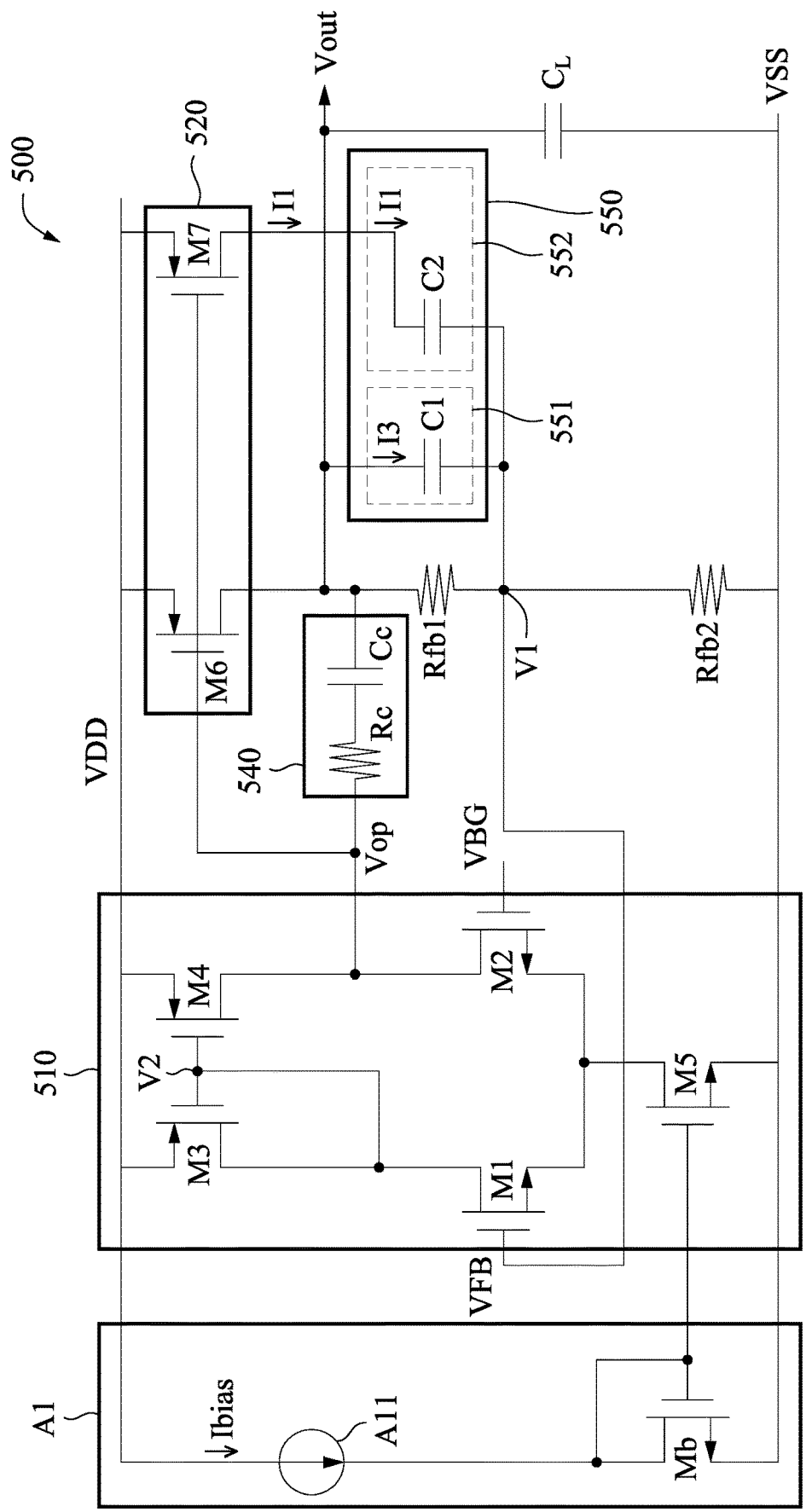
FIG. 5 is a circuit diagram of the LDO regulator corresponding to the LDO regulators shown in FIG. 1 or FIG. 2, in accordance with some embodiments of the present disclosure.
Figure 6:
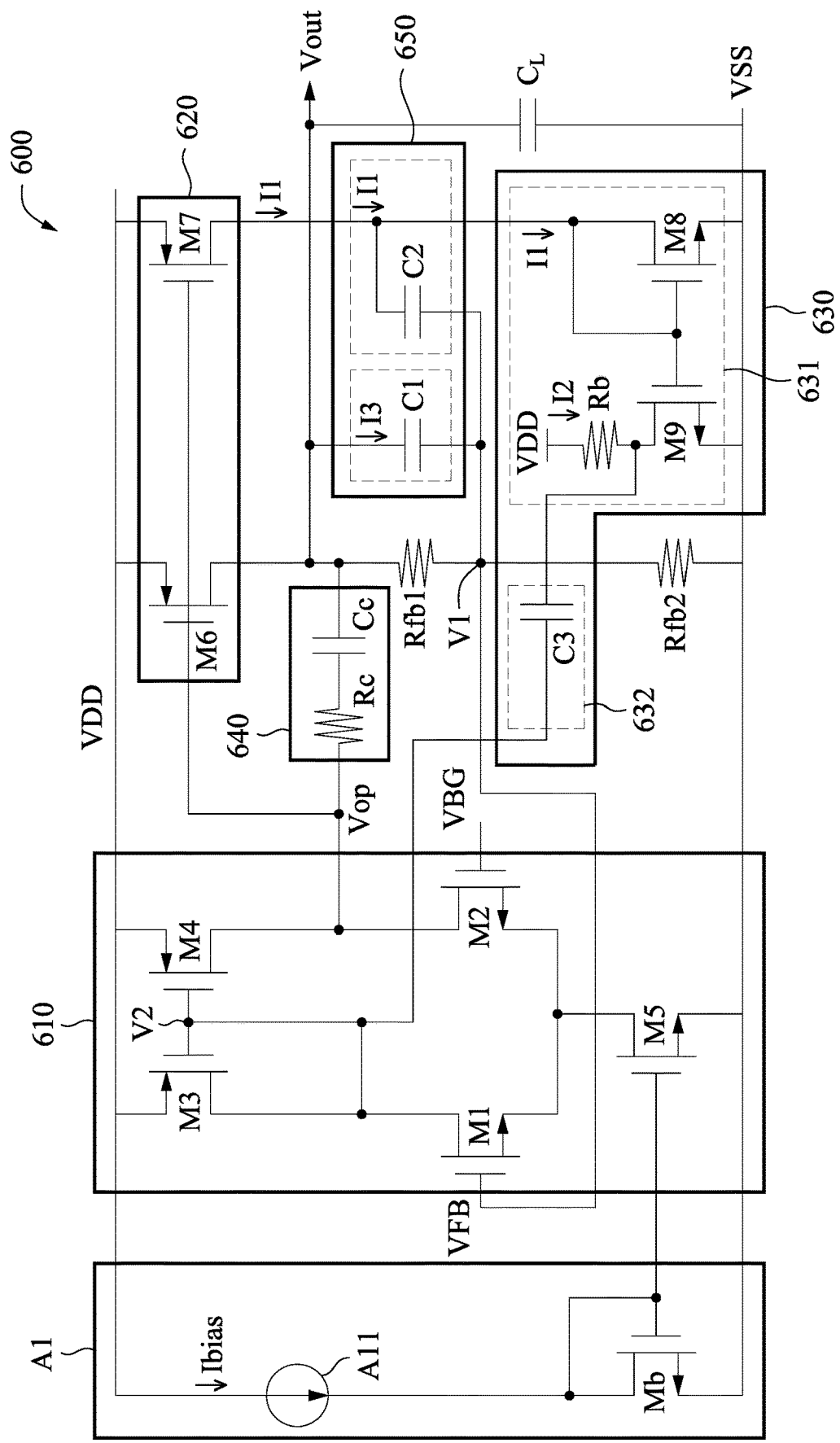
FIG. 6 is a circuit diagram of the LDO regulator corresponding to the LDO regulators shown in at least on of FIG. 1, FIG. 2, FIG. 3, or FIG. 5, in accordance with some embodiments of the present disclosure.

An input of the LDO regulator 110 is coupled to a power supply (which is shown in FIG. 3, or FIGS. 5-6), and the output of the LDO regulator 110 is coupled to the capacitor $C_L$. The output of the LDO regulator 110 is indicated as an output node Vout. A first terminal of the capacitor $C_L$ is coupled to the output node Vout, and a second terminal of the capacitor $C_L$ is coupled to the ground. The load 120 is coupled between the first terminal of the capacitor $C_L$ and the ground.

In some embodiments, the ground illustrated in FIG. 1 refers to a power supply with a low voltage level.

The LDO regulator 110 is configured to control a voltage at the output node Vout within a specific dropout voltage range. In some embodiments, the LDO regulator 110 is configured to provide a specific output voltage to the output node Vout. In some embodiments, when the voltage of the output node Vout exceeds the specific output voltage, the LDO regulator 110 decreases the voltage of the output node Vout until the voltage of the output node Vout is substantially equal to the specific output voltage. In various embodiments, when the voltage of the output node Vout is below the specific output voltage, the LDO regulator 110 increases the voltage of the output node Vout until the voltage of the output node Vout is substantially equal to the specific output voltage.

The capacitor $C_L$ is configured to filter noises of the signal outputted from the LDO regulator 110 by coupling the signal from the LDO regulator 110 to the load 120. In some embodiments, the capacitor $C_L$ is functions as a low-pass filter for decreasing ripple voltage of the signal outputted from the LDO regulator 110.

The load 120 is configured to operate based on the signal outputted from the LDO regulator 110. In some embodiments, the load 120 is a main functional electronic component in the circuit 100. In some embodiments, the load 120 is implemented by a circuit. In various embodiments, the load 120 is implemented by a circuit with high bandwidth and noise sensitivity.

The configuration of the circuit 100 shown in FIG. 1 is given for illustrative purposes. Various configurations of the circuit 100 are within the contemplated scope of the present disclosure. For example, in various embodiments, the LDO regulator 110 and the capacitor $C_L$ are integrated together.

In order to maintain the stable voltage within the specific voltage range of the signal inputted to the load 120 and in order to reduce wide-band noise and ripple of the signal inputted to the load 120 as well, an output circuit and a feedback circuit are included in the LDO regulator 110, which are discussed above with reference to FIG. 2.

Figure 2:
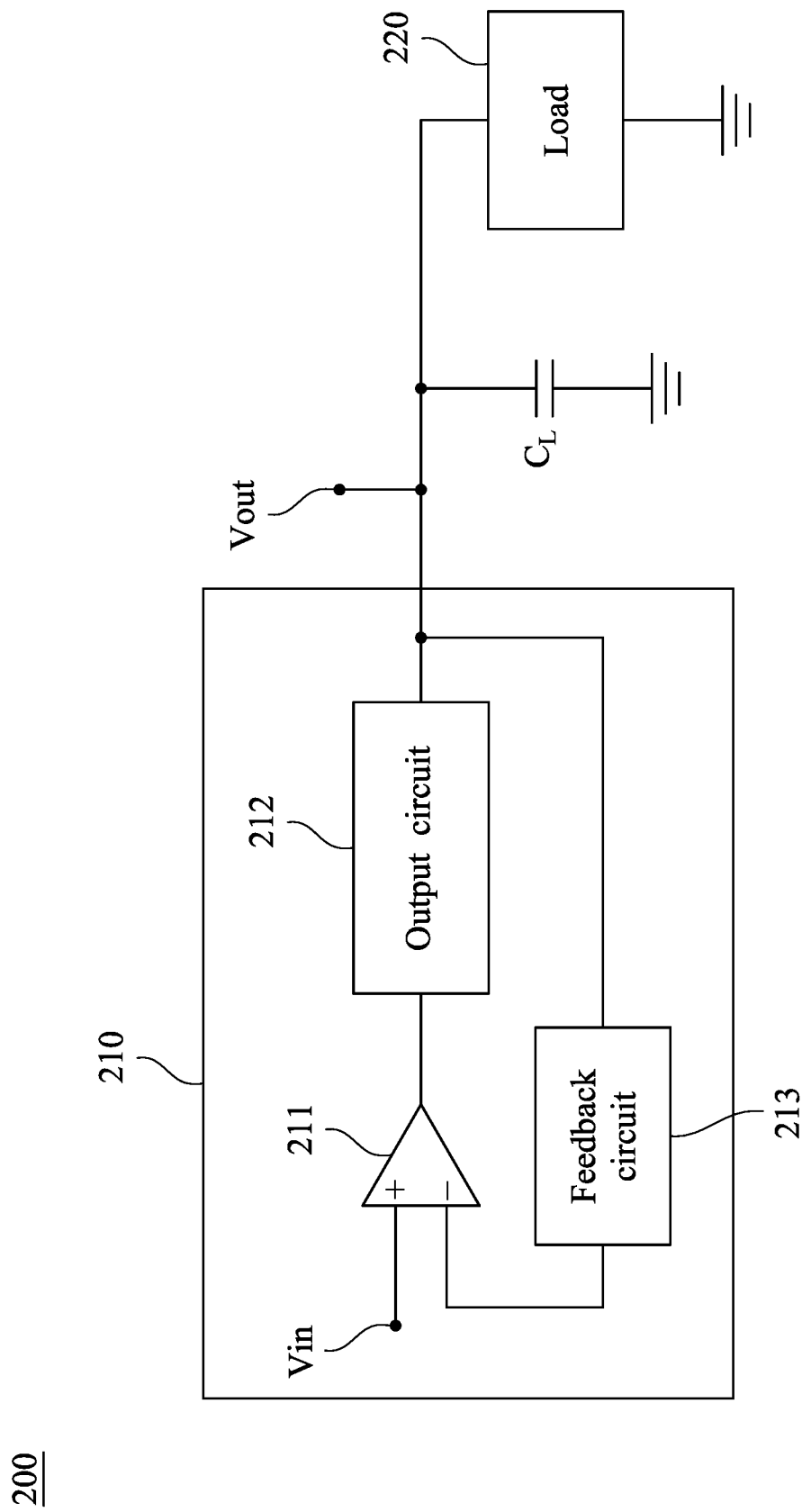
FIG. 2 is a schematic diagram of a circuit corresponding to the circuit shown in FIG. 1, in accordance with some embodiments of the present disclosure.

Reference is now made to FIG. 2. FIG. 2 is a schematic diagram of a circuit 200 associated with the circuit 100 shown in FIG. 1, in accordance with some embodiments of the present disclosure. The circuit 200 includes a LDO regulator 210, a load 220 and the capacitor $C_L$ of FIG. 1. The LDO regulator 210 in FIG. 2 corresponds to the LDO regulator 110 in FIG. 1, and the load 220 in FIG. 2 corresponds to the load 120 in FIG. 1. Compared to FIG. 1, the LDO regulator 210 is illustrated to include an operational amplifier 211, an output circuit 212, and a feedback circuit 213.

For illustration in FIG. 2, an output terminal of the operational amplifier 211 is coupled to the output circuit 212. An input terminal of the operational amplifier 211 with notation as "−" is coupled to an output terminal of the feedback circuit 213. The other input terminal of the operational amplifier 211 with notation as "+" is coupled to an input node Vin for receiving an input voltage. The output circuit 212 is coupled to the feedback circuit 213. In some embodiments, the output circuit 212 is further coupled to the power supply (which is shown in FIG. 3, or FIGS. 5-6).

The operational amplifier 211 is configured to receive feedback signals from the feedback circuit 213, and is configured to generate the amplified signal, in response to the feedback signals. In some embodiments, the input terminal of the operational amplifier 211 with notation as "+" is configured to receive a supply signal generated from the power supply (which is shown in FIG. 3, or FIGS. 5-6). In some embodiments, the other input terminal of the operational amplifier 211 with notation as "−" is coupled to the feedback circuit 213, and is configured to receive the feedback signals from the feedback circuit 213.

The configuration of the operational amplifier 211 is given for illustrative purposes. Various configurations of the operational amplifier 211 are within the contemplated scope of the present disclosure. For example, in some embodiments, the operational amplifier 211 is implemented by a non-inverting amplifier. In various embodiments, the operational amplifier 211 is implemented by an inverting amplifier. Compared to the non-inverting amplifier, the inverting amplifier has opposite input terminals with "+" and "−" phases.

The output circuit 212 is configured to modulate the amplified signal generated from the operational amplifier 211 to have the specific dropout voltage. In some embodiments, the output circuit 212 is configured to receive the supply voltage signal from the power supply, and is configured to generate a current signal, in response to the output of the operational amplifier 211.

The feedback circuit 213 is configured to couple the feedback signals fed back to the operational amplifier 211, in response to the signal outputted from the output circuit 212.

The configuration of the LDO regulator 210 shown in FIG. 2 above is given for illustrative purposes. Various configurations of circuits to implement the LDO regulator 210 in FIG. 2 are within the contemplated scope of the present disclosure. For example, in some embodiments, the feedback circuit 213 and the output circuit 212 are integrated together. In alternative embodiments, the output circuit 212 is included in the operational amplifier 211.

In some approaches, the load is at least one of a phase lock loop (PLL), a voltage-controlled oscillator (VCO), an analog-to-digital converter (ADC) or a digital-to-analog converter (DAC). In such approaches, the signal inputted to the PLL operating as the load has noise with wide bandwidth and ripple, and clock signals generated from the PLL have extra jitter. Therefore, quality of the clock signal is decreased, and it is difficult to design circuits.

Compared to the approach described above, with the configurations of the present disclosure, the output circuit 212 and the feedback circuit 213 are included in the LDO regulator 210, for providing feedback signals fed back to the operational amplifier 211. As such, the ripple of the signal inputted to the load 220 is reduced.

Reference is now made to FIG. 3. FIG. 3 is a circuit diagram of a LDO regulator 300 associated with the LDO regulator 110 shown in FIG. 1 or the LDO regulator 210 shown in FIG. 2, in accordance with some embodiments of the present disclosure.

For illustration in FIG. 3, the LDO regulator 300 is coupled between a power supply A1 and the capacitor $C_L$, which is also coupled to a load (which is shown in FIGS. 1-2). Specifically, an input of the LDO regulator 300 is coupled to the power supply A1, and an output of the LDO regulator 300. The output of the LDO regulator 300 is indicated as an output node Vout, and is coupled to the capacitor $C_L$ and the load, including, for example, the load 120 of FIG. 1 and the load 220 of FIG. 2.

In some embodiments, the capacitor $C_L$ is configured based on the load for coupling the output signal outputted from the LDO regulator 300 to the load.

The LDO regulator 300 is configured to generate a signal (not shown) to the load with a stable voltage within the specific voltage range, in response to supply signals generated from the power supply A1 and feedback signals which will be discussed below.

The power supply A1 is configured to provide at least one of a supply current signal or supply voltage signal to the LDO regulator 300. For illustration in FIG. 3, the power supply A1 includes a current source A11 and a transistor Mb which, in some embodiments, is n-type metal oxide semiconductor transistor (NMOS transistor). With reference to FIG. 3, in some embodiments, the power supply A1 provides the supply current signal Ibias and the supply voltage signals VDD and VSS.

The current source A11 is coupled to the transistor Mb and the LDO regulator 300. A gate of the transistor Mb is coupled to a drain of the transistor Mb. The gate of the transistor Mb is also coupled to an output of the current source A11. In addition, the gate of transistor Mb is further coupled to an input terminal of the LDO regulator 300. A source of the transistor Mb is coupled to the LDO regulator 300, which is also coupled to the ground noted as VSS.

The current source A11 is configured to provide the supply current signal Ibias to the LDO regulator 300 through the transistor Mb to the LDO regulator 300.

The transistor Mb functions as a diode-connected transistor, to consume a voltage difference as an active load. In some embodiments, the transistor Mb is configured to receive the supply current signal Ibias generated from the current source A11, and is configured to provide the supply current signal Ibias to the input terminal of the LDO regulator 300. In some embodiments, the transistor Mb is configured to mirror the supply current signal Ibias to the LDO regulator 300, for driving the LDO regulator 300. Alternatively stated, with reference to FIG. 3, in operations, the transistor Mb is configured to mirror the supply current signal Ibias from the current source A11 to the transistor M5 of an operational amplifier 310 of the LDO regulator 300.

The configuration of power supply A1 shown in FIG. 3 is given for illustrative purposes. Various configurations of circuits to implement the power supply A1 in FIG. 3 are within the contemplated scope of the present disclosure. For example, in some embodiments, in addition to the transistor Mb shown in FIG. 3, the power supply A1 includes more than one diode-connected transistor coupled to the transistor Mb in series. In various embodiments, the power supply A1 further includes a voltage source (not shown) which is integrated with the current source A11.

For illustration in FIG. 3, the LDO regulator 300 includes an operational amplifier 310, an output circuit 320, a feedback circuit 330, a compensation circuit 340, and divided resistors Rfb1 and Rfb2. The operational amplifier 310, the output circuit 320, the feedback circuit 330, the compensation circuit 340, and the divided resistors Rfb1 and Rfb2 are coupled.

In some embodiments, the operational amplifier 310 shown in FIG. 3 corresponds to the operational amplifier 211 shown in FIG. 2. The output circuit 320 shown in FIG. 3 corresponds to the output circuit 212 shown in FIG. 2. The feedback circuit 330 shown in FIG. 3 corresponds to the feedback circuit 213 shown in FIG. 2.

Moreover, for illustration in FIG. 3, the operational amplifier 310 is coupled to the power supply A1, the output circuit 320, the feedback circuit 330, and the compensation circuit 340.

In operations, in some embodiments, the operational amplifier 310 is configured to be driven by the power supply A1, and is configured to receive feedback signals, including, for example, a feedback signal from the feedback circuit 330, or a feedback signal VFB from the divided resistors Rfb1 and Rfb2. The feedback signal VFB from the divided resistors Rfb1 and Rfb2 is further transmitted from the output terminal of the LDO regulator 300 (i.e., the output node Vout). In some embodiments, the operational amplifier 310 is operated by a bias current source, for example, the power supply A1 shown in FIG. 3.

The operational amplifier 310 is further configured to output an amplified signal (not shown) to the output terminal of the operational amplifier 310 (i.e., the node Vop). The output terminal of the operational amplifier 310 is indicated as a node Vop in FIG. 3. In some embodiment, in the operation of outputting the amplified signal, the operational amplifier 310 eliminates the feedback signal VFB. The amplified signal outputted from the operational amplifier 310 is based on comparison signals, including, for example, the supply voltage signals VDD and VSS, a reference voltage signal VBG, and feedback signals.

With reference to FIG. 3, the operational amplifier 310 includes transistors M1-M2 which, in some embodiments, are NMOS transistors, transistors M3-M4 which, in some embodiments, are p-type metal oxide semiconductor transistors (PMOS transistor), and a transistor M5 which, in some embodiments, is an NMOS transistor.

In some embodiments, the operational amplifier 310 is implemented as a single-stage amplifier, in order to apply signal with low gain but a wide frequency bandwidth including a high frequency bandwidth. Therefore, the amplified signal outputted from the operational amplifier 310 corresponds to low frequency bandwidth that keeps sufficient low frequency high power supply rejection ratio (PSRR), which will be discussed below with reference to FIG. 4.

A gate of the transistor M1 is coupled to a node V1, which is also coupled between divided resistors Rfb1 and Rfb2. A drain of the transistor M1 is coupled to a drain of the transistor M3. A source of the transistor M1 is coupled to a source of the transistor M2, which is also coupled to a drain of the transistor M5.

A gate of the transistor M2 is coupled to a reference circuit (not shown) through a reference voltage signal VBG. A drain of the transistor M2 is coupled to a drain of the transistor M4. A source of the transistor M2 is coupled to a source of the transistor M1, which is also coupled to a drain of the transistor M5.

A gate of the transistor M3 is coupled to a drain of the transistor M3. The gate of the transistor M3 is also coupled to a gate of the transistor M4, which is indicated as a node V2. In addition, the gate of transistor M3 is further coupled to the feedback circuit 330. A source of the transistor M3 is configured to receive the supply voltage signal VDD.

A gate of the transistor M4 is coupled to a node V2, which is also coupled to the gate of the transistor M3 and the drain of the transistor M3. The gate of the transistor M4 is further coupled to the feedback circuit 330. A drain of the transistor M4 is coupled to the drain of the transistor M2, which is also indicated as the output terminal of the operational amplifier 310, noted as the node Vop. The drain of the transistor M4 is further coupled to the output circuit 320 and the compensation circuit 340. A source of the transistor M4 is configured to receive the supply voltage signal VDD.

A gate of the transistor M5 is coupled to the gate of transistor Mb of the power supply A1. A drain of the transistor M5, a source of the transistor M1, and a source of the transistor M2 are coupled together. A source of the transistor M5 is coupled to the ground VSS.

In some embodiments, the signal at the node V1 is a divided signal of the output signal from the output node Vout. The divided signal is divided by the divided resistors Rfb1 and Rfb2. Therefore, the signal at the node V1 includes a ripple signal in the output signal from the output node Vout. In some embodiments, the divided resistors Rfb1 and Rfb2 have the same resistance. The voltage at the node V1, which is also the voltage at the gate of the transistor M1, is half of the voltage at the output node Vout.

The transistor M1 is configured to receive the feedback signal VFB including the ripple signal in the output signal from the output node Vout. Alternatively stated, the ripple signal included in the feedback signal VFB is associated with the ripple signal in the output signal outputted from the LDO regulator 300.

The transistor M2 is configured to receive the reference voltage signal VBG from the reference circuit. In some embodiments, the reference circuit is configured to provide a fixed voltage signal to the transistor M2, based on the voltage of the output signal provided to the load (which is shown in FIGS. 1-2) at the output node Vout. With reference to FIG. 3, in some embodiments, the reference voltage signal VBG is provided to have the same voltage value of the feedback signal VFB received by the transistor M1.

The arrangement or configuration of the reference circuit is given for illustrative purposes. Various arrangement or configurations of the reference circuit are within the contemplated scope of the present disclosure. For example, in various embodiments, the reference circuit is implemented by a voltage source. In various embodiments, the reference circuit is included in the power supply A1.

In some embodiments, the transistors M1-M2 function as a differential pair circuit to receive a differential voltage signal VFB and VBG. In some embodiments, the transistors M1-M2 function as an amplifying transistor to generate the amplified signal. In some embodiment, in the operation of generating the amplified signal, the amplifying transistor eliminates the feedback signal VFB from the divided resistors Rfb1 and Rfb2.

The transistor M3 is configured to receive the feedback signal coupled from the feedback circuit 330. In some embodiments, the transistors M3 functions as a diode-connected transistor, to consume a voltage difference as an active load.

The transistor M4 functions as an output of the operational amplifier 310 to output the amplified signal at the node Vop.

In operations, in some embodiments, the transistor M4 is configured to receive the signal mirrored from the transistor M3, and is configured to output the amplified signal at the node Vop.

The transistor M5 is configured to receive the supply signal Ibias from the power supply A1. Therefore, the transistor M5 is biased with the supply signal Ibias to be turned on, which is configured to turn on the remaining transistors M1-M4 of the operational amplifier 310.

The configuration of operational amplifier 310 shown in FIG. 3 is given for illustrative purposes. Various configurations of circuits to implement the operational amplifier 310 in FIG. 3 are within the contemplated scope of the present disclosure. For example, in various embodiments, in addition to the transistors M1-M2 shown in FIG. 3, the operational amplifier 310 includes more than one amplifying transistors coupled to the transistors M1-M2 in parallel, in order to implement a multi-stage amplifier.

With continued reference to FIG. 3, the output circuit 320 is coupled between the output terminal of the LDO regulator 300 (i.e., the output node Vout) and the output terminal of the operational amplifier 310 (i.e., the node Vop), and is further coupled to the feedback circuit 330. The output circuit 320 is also coupled between the power supply A1 and the output terminal of the operational amplifier 310 (i.e., the node Vop), and is further coupled to the compensation circuit 340.

In operations, in some embodiments, the output circuit 320 is configured to receive the supply voltage signal VDD, and is configured to generate an output signal within a specific dropout voltage range, based on the load coupled at the output node Vout. Alternatively stated, the output signal within a specific dropout voltage range is generated by the output circuit 320, in response to the supply voltage signal VDD from the power supply A1 and the output signal from the LDO regulator 300.

The output circuit 320 is further configured to generate the output signal, including a current signal I1, in response to the amplified signal outputted from the operational amplifier 310 and the supply voltage signal VDD from the power supply A1.

The output circuit 320 is also configured to mirror the output signal, including a current signal I1 that is associated with the supply voltage signal VDD, to the feedback circuit 330.

With reference to FIG. 3, the output circuit 320 includes transistors M6-M7 which, in some embodiments, are PMOS transistors. A gate of the transistor M6 is coupled to the output terminal of the operational amplifier 310 (i.e., the node Vop), which is also coupled to the drain of the transistor M4 and the drain of the transistor M2. The gate of transistor M6 is further coupled to the compensation circuit 340. A drain of the transistor M6 is coupled to the output node Vout, which is further coupled to the compensation circuit 340. A source of the transistor M6 is configured to receive the supply voltage signal VDD.

In some embodiments, the transistor M6 is configured to receive the amplified signal outputted from the operational amplifier 310. In some embodiments, the transistor M6 functions as a pass element, to provide the output signal within the dropout voltage to the output of the LDO regulator 300 (i.e., the output node Vout). In some embodiments, the transistor M6 is configured to modulate the dropout voltage of the LDO regulator 300, based on the structure of the transistor M6. In some embodiments, transistor M6 is configured to be controlled by the operational amplifier 310 (alternatively stated, by the transistor M4), in order to control the output signal provided to the output of the LDO regulator 300 (i.e., the output node Vout).

A gate of the transistor M7 is coupled to the gate of transistor M6. The gate of the transistor M7 is further coupled to the output terminal of the operational amplifier 310 (i.e., the node Vop), which is also coupled to the drain of the transistor M4, the drain of the transistor M2, and the compensation circuit 340. A drain of the transistor M7 is coupled to the feedback circuit 330. A source of the transistor M7 is configured to receive the supply voltage signal VDD.

In some embodiments, the transistor M7 is configured to receive the signal coupled from the transistor M6. In some embodiments, the transistor M7 is configured to provide the current signal I1 to the feedback circuit 330. In some embodiments, the transistor M7 functions as a pass element, to provide the current signal I1 mirrored from the transistor M6, in response to the supply voltage signal VDD, to the feedback circuit 330. Therefore, the current signal I1 outputted from the output circuit 320 includes the ripple signal in the supply voltage signal VDD.

The configuration of output circuit 320 shown in FIG. 3 is given for illustrative purposes. Various configurations of circuits to implement the output circuit 320 in FIG. 3 are within the contemplated scope of the present disclosure. For example, in various embodiments, a size of the transistor M6 is smaller than a size of the transistor M7 with smaller parasitic capacitance in order to reduce the ripple signal coupled from the supply voltage signal VDD to the output of the LDO regulator 300.

With continued reference to FIG. 3, the feedback circuit 330 is coupled between the operational amplifier 310 and the output circuit 320.

In operations, in some embodiments, the feedback circuit 330 is configured to receive the output signal (i.e., the current signal I1) outputted from the output circuit 320.

In order to adjust the output signal, the feedback circuit 330 is further configured to couple an amplified current signal to the operational amplifier 310, in response to the current signal I1. The amplified current signal is referred as the feedback signal (i.e., the current signal I2), and is associated with the supply voltage signal VDD.

With reference to FIG. 3, the feedback circuit 330 includes a current mirror unit 331 and a capacitive unit 332. The current mirror unit 331 is coupled between the output circuit 320 and the capacitive unit 332. The capacitive unit 332 is coupled between the current mirror unit 331 and the input terminal of the operational amplifier 310 (i.e., the node V2).

The current mirror unit 331 is configured to provide the amplified current signal (i.e., the current signal I2) to the capacitive unit 332 by mirroring the current signal (i.e., the current signal I1). The capacitive unit 332 is configured to couple the amplified current signal (i.e., the current signal I2) to the input terminal of the operational amplifier 310 (i.e., the node V2).

With reference to FIG. 3, the current mirror unit 331 is implemented by including transistors M8-M9 and a resistor Rb, In some embodiments, the transistors M8-M9 are NMOS transistors. Alternatively stated, the transistors M8-M9 and the resistor Rb function as a current mirror.

A gate of the transistor M8 is coupled to a drain of the transistor M8. The gate of the transistor M8 is further coupled to the drain of the transistor M7 of the output circuit 320. In addition, the gate of the transistor M8 is further coupled to a gate of the transistor M9. A source of the transistor M8 is coupled to the ground noted as VSS.

In some embodiments, the transistor M8 is configured to receive the current signal I1 from the transistor M7. In some embodiments, the transistor M8 functions as a diode-connected transistor to consume a voltage difference as an active load, and to provide a direct current (dc) bias signal, indicated as the current signal I1, to the transistor M9.

With reference to FIG. 3, in some embodiments, the transistor M8 is configured to receive the current signal I1 mirrored from the transistor M7, in response to the supply voltage signal VDD. Therefore, the current signal I1 includes the ripple signal in the supply voltage signal VDD. Alternatively stated, a current mirror path is formed through the transistor M7 to the transistor M8, and to the ground VSS. The current mirror path is configured to carry the current signal I1, which includes the ripple signal in the supply voltage signal VDD.

A gate of the transistor M9 is coupled to the gate of the transistor M8. A drain of the transistor M9 is coupled to one terminal of the resistor Rb. The drain of the transistor M9 is further coupled to one terminal of the capacitor C3. A source of the transistor M9 is coupled to the ground VSS. One terminal of the resistor Rb is coupled to the drain of the transistor M9, and the other one is configured to receive the supply voltage signal VDD.

In some embodiments, the transistor M9 is configured to receive the current signal I1 provided from the transistor M8.

In some embodiments, the resistor Rb is configured to bias the voltage of the drain of the transistor M9, in order to make the transistor M9 operate in a saturation region, for enhancing the gain of the transistor M9 and amplifying the current signal I1 provided from the transistor M8.

In operations, in some embodiments, the transistor M8 is configured to mirror the current signal I1 to the transistor M9. The transistor M9 is configured to generate the amplified current signal (i.e., the current signal I2) from the current signal I1, based on the resistor Rb. As such, the current signal I2 is the amplified signal of the current signal I1. The transistor M9 is further configured to mirror the current signal I2 to the capacitor C3.

Since the current signal I1 includes the ripple signal associated with the supply voltage signal VDD, the current I2 includes the amplified ripple signal of the ripple signal included in the current signal I1. Therefore, the current signal I2 provided by the current mirror unit 331 includes the amplified ripple signal in the supply voltage signal VDD.

With reference to FIG. 3, the capacitive unit 332 is implemented by a capacitor C3. In various embodiments, the capacitive unit 332 is implemented by the capacitor C3 and the resistor Rfb2 of FIG. 3. In other embodiments, in addition to the capacitor C3, the capacitive unit 332 is implemented by more than one capacitor which is coupled to the capacitor C3 in parallel.

The capacitor C3 is coupled between current mirror unit 331 and the operational amplifier 310. One terminal of the capacitor C3 is coupled to the drain of the transistor M9 which is also coupled to the resistor Rb, and the other one terminal of the capacitor C3 is coupled to the input terminal of the operational amplifier 310 (i.e., the node V2).

In operations, in some embodiments, the capacitive unit 332 is configured to receive the amplified current signal (i.e., the current signal I2), and is configured to couple the amplified current signal (i.e., the current signal I2) to the input terminal of the operational amplifier 310 (i.e., the node V2). Alternatively stated, the current signal I2 is coupled through the capacitive unit 332 to the input terminal of the operational amplifier 310, which is referred as the gates of the transistors M3 and M4. To explain in another way, a feedback path is formed from the current mirror unit 331 to the capacitive unit 332, and back to the operational amplifier 310. Therefore, the feedback signal (i.e., the current signal I2) is feedbacked to the operational amplifier 310 along the feedback path, to be cancelled from the amplified signal outputted from the operational amplifier 310.

In some embodiments, since the current signal I2 includes the amplified ripple signal of the ripple signal included in the current signal I1, the amplified ripple is associated with the supply voltage signal VDD. The current signal I2 is indicated as the feedback signal in some embodiments of the present disclosure. Therefore, the amplified ripple signal of the ripple signal in the supply voltage signal VDD may be eliminated by operational amplifier 310.

In some embodiments, because the transistor M9 is implemented by the NMOS transistor, a phase of the current signal I2 is 180° different from a phase of the current signal I1. In such embodiments, the current signal I2 has the opposite phase from other signals, including, for example, the current signal I1 or the feedback signal VFB. Therefore, the current signal I2 received at one input terminal of the operational amplifier 310 (i.e., the node V2) and the feedback signal VFB received at another input terminal of the operational amplifier 310 (i.e., the gate of the transistor M1) have opposite phases.

The configuration of feedback circuit 330 shown in FIG. 3 is given for illustrative purposes. Various configurations of circuits to implement the feedback circuit 330 in FIG. 3 are within the contemplated scope of the present disclosure. For example, in various embodiments, in addition to the current mirror unit 331 shown in FIG. 3, the feedback circuit 330 includes more than one current mirror unit coupled to the current mirror unit 331 in series, for providing the multi-amplified signal to the capacitive unit 332.

With continued reference to FIG. 3, the compensation circuit 340 is coupled to the output terminal of the operational amplifier 310 (i.e., the node Vop), the output circuit 320, the output terminal of the LDO regulator 300 (i.e., the output node Vout), and the feedback circuit 330. In some embodiments, the compensation circuit 340 is configured to stabilize the LDO regulator 300.

With reference to FIG. 3, the compensation circuit 340 includes a resistor Rc and a capacitor Cc. The resistor Rc and the capacitor Cc are coupled in series.

One terminal of the resistor Rc is coupled to the output terminal of the operational amplifier 310 (i.e., the node Vop), and the other one is coupled to the capacitor Cc. One terminal of the capacitor Cc is coupled to the resistor Rc, and the other one is coupled to the output terminal of the LDO regulator 300 (i.e., the output node Vout).

In some approaches, the LDO regulator only includes an operational amplifier and a pass element. The LDO regulator provides the specific voltage within a specific voltage dropout merely based on the signal generated from the power supply. the ripple signal is included in the signal generated from the power supply. Accordingly, the ripple signal is transmitted between the operational amplifier and the pass element, and is subsequently outputted to the load for operation. In such arrangements, when the LDO regulator is applied in the system-on-chip (SOC), the signal outputted from the LDO regulator has poor PSRR which leads to bad performance for operating the load. The details of the PSRR will be discussed in the following paragraphs.

Compared to the above approaches, with the configurations of the present disclosure, at least one feedback path is provided to eliminate the ripple signal (i.e., feedback signal (for example, the current signal I2) coupled to one input terminal of the operational amplifier 310). Furthermore, the feedback circuit 330 is also included in the LDO regulator 300, and is configured to couple the feedback signals, for example, including the current signal I2 from the output circuit 320 to the operational amplifier 310. Therefore, the amplified signal is generated, under the operations, including, for example, eliminating the feedback signal VFB coupled from the output node Vout and the current signal I2 coupled from the feedback circuit 330, by the operational amplifier 310. Accordingly, the signal outputted from the LDO regulator 300 does not affected by the ripple signal in the power supply A1. In this situation, when the LDO regulator 300 is applied in the SOC, the signal outputted from the LDO regulator 300 has good PSRR, which would lead to good performance for operating the load.

Figure 4:
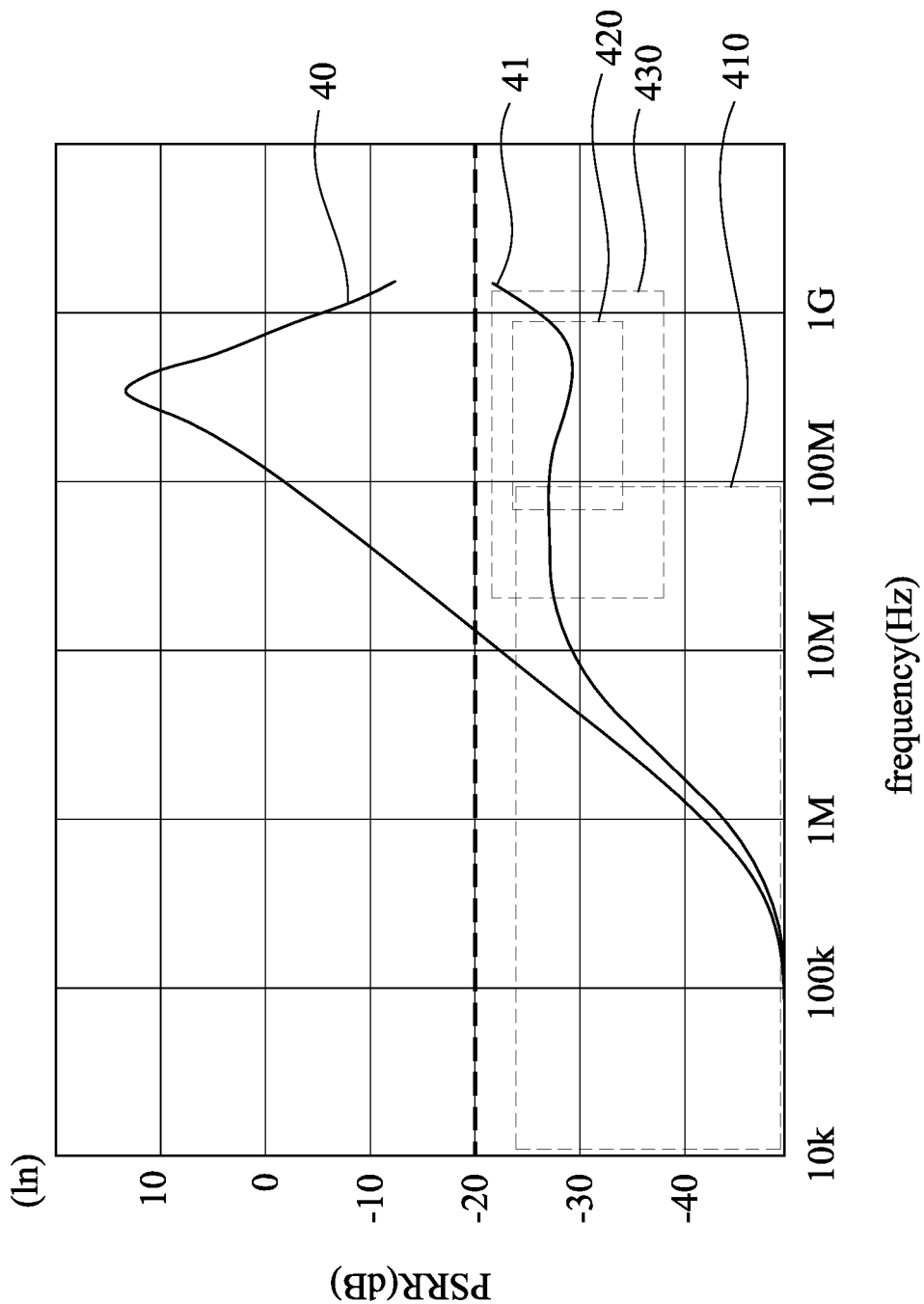
FIG. 4 is a bode diagram of the LDO regulator, in accordance with some embodiments of the present disclosure.

Reference is now made to FIG. 4. FIG. 4 is a bode diagram of LDO regulator, in accordance with some embodiments of the present disclosure. FIG. 4 illustrates at least one example of a bode diagram with PSRR as a function of frequency for the LDO regulator in accordance with the conventional approach, and at least one of the LDO regulator 300 of FIG. 3, the LDO regulator 500 of FIG. 5, or the LDO regulator 600 of FIG. 6, in accordance with some embodiments of the present disclosure.

For illustration in FIG. 4, the bode diagram indicates frequency on x-axis and PSRR on y-axis. A curve 40 is an exemplary result implemented by the LDO regulator in the SOC, according to the conventional approach. A curve 41 is an exemplary result implemented by the LDO regulator in the SOC, according to some embodiments of the present disclosure.

Since the LDO regulator is coupled between the power supply and the load, the PSRR is generally used as a parameter, to describe the capability of the LDO regulator for suppressing the variation, including, for example, the ripple signal, of supply signal to the output signal of the LDO regulator. The lower PSRR indicates a better suppressing ability, which results in the less ripple signal in the output signal provided to the load.

For the LDO regulator implemented by the conventional approach, the curve 40 is above about −20 dB at about 10 M-1 GHz, which indicates the signal outputted from the LDO regulator cannot suppress the ripple signal of the supply signal in a wide frequency bandwidth. Moreover, the curve 40 has a peak at high frequency, for example, within 100 M-1 GHz, which indicates the LDO regulator has a poor suppression ability at a high frequency bandwidth.

For the LDO regulator implemented by some embodiments of the present disclosure, the curve 41 is below about −20 dB, which indicates the signal outputted from the LDO regulator could suppress the ripple signal of the supply signal. Moreover, the curve 42 is a smooth curve in a wide frequency bandwidth, for example, less than about 1 GHz, which indicates the LDO regulator has good suppression ability in a wide frequency bandwidth.

With reference to FIGS. 3-4, in some embodiments, the signal outputted from the operational amplifier 310 corresponds to a block 410 in FIG. 4, which indicates the suppression ability contributed by the operational amplifier 310. Alternatively stated, the operational amplifier 310 focuses on the suppressing the ripple signal at low frequency bandwidth.

With reference to FIGS. 3-4, in some embodiments, the signal outputted from the feedback circuit 330 corresponds to a block 420 in FIG. 4, which indicates the suppression ability contributed by the feedback circuit 330. Alternatively stated, the feedback circuit 330 focuses on the suppressing the ripple signal at mid-to-high frequency bandwidth.

A block 430 will be discussed with reference to FIG. 5 in the following paragraphs.

Reference is now made to FIG. 5. FIG. 5 is a circuit diagram of LDO regulator 500 associated with at least one of the LDO regulator 110 shown in FIG. 1 or the LDO regulator 210 shown in FIG. 2, in accordance with some embodiments of the present disclosure. With respect to the embodiments of FIG. 5, like elements in FIG. 3 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5.

For illustration in FIG. 5, the LDO regulator 500 is coupled between a power supply A1 and the capacitor $C_L$, which is also coupled to the load (which is shown in FIGS. 1-2). Specifically, the input of the LDO regulator 500 is coupled to the power supply A1, and the output of the LDO regulator 500. The output of the LDO regulator 500 is indicated as an output node Vout, and is coupled to the capacitor $C_L$ and the load, including, for example, the load 120 of FIG. 1 and the load 220 of FIG. 2.

The LDO regulator 500 is configured to generate the signal to the load with stable voltage within the specific dropout voltage, in response to supply signals generated from the power supply A1 and feedback signals which will be discussed below.

In some embodiments, the power supply A1 and the capacitor $C_L$ shown in FIG. 5 corresponds to the power supply A1 and the capacitor $C_L$ shown in FIG. 3, respectively.

The LDO regulator 500 includes an operational amplifier 510, an output circuit 520, a compensation circuit 540, a feedback circuit 550, and divided resistors Rfb1 and Rfb2. The operational amplifier 510, the output circuit 520, the compensation circuit 540, the feedback circuit 550, and the divided resistors Rfb1 and Rfb2 are coupled.

In some embodiments, the operational amplifier 510 shown in FIG. 5 corresponds to the operational amplifier 211 shown in FIG. 2, the output circuit 520 shown in FIG. 5 corresponds to the output circuit 212 shown in FIG. 2, and the feedback circuit 550 shown in FIG. 5 corresponds to the feedback circuit 213 shown in FIG. 2.

In some embodiments, the operational amplifier 510 shown in FIG. 5 corresponds to the operational amplifier 310 shown in FIG. 3, the output circuit 520 shown in FIG. 5 corresponds to the output circuit 320 shown in FIG. 3, compensation circuit 540 shown in FIG. 5 corresponds to the compensation circuit 340 shown in FIG. 3, and the divided resistors Rfb1 and Rfb2 shown in FIG. 5 corresponds to the divided resistors Rfb1 and Rfb2 shown in FIG. 3.

Compared to the embodiments illustrated in FIG. 3, the LDO regulator 500 includes the feedback circuit 550 rather than the feedback circuit 330 in FIG. 3. The feedback circuit 550 is coupled between the operational amplifier 510 and the output terminal of the LDO regulator 500 (i.e., the output node Vout). The feedback circuit 550 is also coupled between the operational amplifier 510 and the output circuit 520.

In operations, in some embodiments, the operational amplifier 510 is configured to be driven by the power supply A1, and is configured to receive feedback signals, including, for example, the feedback signal VFB from the feedback circuit 550 and the divided resistors Rfb1 and Rfb2 The feedback signal VFB from the divided resistors Rfb1 and Rfb2 is further transmitted from the output terminal of the LDO regulator 500 (i.e., the output node Vout).

The operational amplifier 510 is further configured to output the amplified signal to the output terminal of the operational amplifier 510 (i.e., the node Vop) In some embodiment, in the operation of outputting the amplified signal, the operational amplifier 510 eliminates the feedback signal VFB.

In operations, in some embodiments, the feedback circuit 550 is configured to receive the output signal (i.e., the current signal I3) outputted from the LDO regulator 500.

In order to adjust the output signal, the feedback circuit 550 is further configured to couple the output signal (i.e., the current signal I3) to the operational amplifier 510, in response to the output of the LDO regulator 500.

With reference to FIG. 5, in some embodiments, the feedback circuit 550 includes a capacitive unit 551 and 552. The capacitive unit 551 is coupled between the output terminal of the LDO regulator 500 (i.e., the output node Vout) and the node V1, which is also indicated as the input terminal of the operational amplifier 510 (i.e., the gate of the transistor M1). The capacitive unit 552 is coupled between the output terminal of the output circuit 520 (i.e., the drain of the transistor M7) and the node V1, which is also indicated as the input terminal of the operational amplifier 510 (i.e., the gate of the transistor M1).

Specifically, the capacitive unit 551 is coupled between the input terminal of the operational amplifier 510, and the output of the LDO regulator 500 (i.e., the output node Vout), which is also coupled to the output circuit 520. With reference to FIG. 5, in some embodiments, the capacitive unit 551 is implemented by a capacitor C1. The capacitive unit 552 is coupled between the input terminal of the operational amplifier 510, and the output of the output circuit 520. With reference to FIG. 5, in some embodiments, the capacitive unit 552 is implemented by a capacitor C2.

In operations, in some embodiments, the capacitive unit 551 is configured to receive the output signal (i.e., the current signal I3) from the output terminal of the LDO regulator 500 (i.e., the output node Vout), and is configured to couple the output signal (i.e., the current signal I3) from the output node Vout to the node V1, which is further coupled to the input terminal of the operational amplifier 510.

In some embodiments, since the current signal I3 is the output signal from the output terminal of the LDO regulator 500 (i.e., the output node Vout), the current signal I3 includes the ripple signal associated with the output signal outputted from the LDO regulator 500. Therefore, the current signal I3 includes the ripple signal in the output signal from the output terminal of the LDO regulator 500 (i.e., the output node Vout). Alternatively stated, the current signal I3 is coupled through the capacitive unit 551 to the input terminal of the operational amplifier 510. The input terminal of the operational amplifier 510 is also referred as the gate of the transistor M1. To explain in another way, the feedback path is formed from the capacitive unit 551 to the divided resistors Rfb1 and Rfb2 (i.e., the node V1), and back to the operational amplifier 510. Therefore, the feedback signal (i.e., signal coupled from the current signal I3) may be feedback to the operational amplifier 510 along such feedback path, to be cancelled from the amplified signal outputted from the operational amplifier 510.

In some embodiments, since the current signal I3 includes the ripple signal included in the output signal from the output terminal of the LDO regulator 500, such ripple signal is associated with the output of the LDO regulator 500 (i.e., the output node Vout). The current signal I3 is indicated as the feedback signal VFB in some embodiments of the present disclosure. Such ripple signal is included in feedback signal VFB, in accordance with some embodiments of the present disclosure. Therefore, the ripple signal included in the output signal from the output terminal of the LDO regulator 500 may be eliminated the by operational amplifier 510.

In operations, in some embodiments, the feedback circuit 550 is further configured to receive the output signal (i.e., the current signal I1) outputted from the output circuit 520.

In order to adjust the output signal, the feedback circuit 550 is further configured to couple the output signal (i.e., the current signal I1), in response to the supply voltage signal VDD, to the operational amplifier 510.

In operations, in some embodiments, the capacitive unit 552 is configured to receive the output signal (i.e., the current signal I1) from the output circuit 520, and is configured to couple the output signal (i.e., the current signal I1) from the output circuit 520 to the node V1, which is further coupled to the input terminal of the operational amplifier 510.

Since the current signal I1 includes the ripple signal associated with the supply voltage signal VDD, the current signal I1 includes the ripple signal associated with the power supply A1. Therefore, the current signal I1 provided by the capacitive unit 552 includes the ripple signal in the supply voltage signal VDD. Alternatively stated, the current signal I1 is coupled through the capacitive unit 552 to the input terminal of the operational amplifier 510, which is referred as the gate of the transistor M1. To explain in another way, the feedback path is formed from the capacitive unit 552 to the divided resistors Rfb1 and Rfb2 (i.e., the node V1), and back to the operational amplifier 510. Therefore, the feedback signal, i.e., signal coupled from the current signal I1, may be feedback to the operational amplifier 510 along such feedback path, to be cancelled from the amplified signal outputted from the operational amplifier 510.

In some embodiments, since the current signal I1 includes the ripple signal included in the supply voltage signal VDD, the ripple signal is associated with power supply, which is indicated as the feedback signal VFB or is included in feedback signal VFB, in accordance with some embodiments of the present disclosure. Therefore, the ripple signal included in the output signal from the output terminal of the LDO regulator 500 may be eliminated the by operational amplifier 510.

The configuration of feedback circuit 550 shown in FIG. 5 is given for illustrative purposes. Various configurations of circuits to implement the feedback circuit 550 in FIG. 5 are within the contemplated scope of the present disclosure. For example, in various embodiments, only the capacitive unit 551 is included in the feedback circuit 550. In other embodiments, only the capacitive unit 552 is included in the feedback circuit 550.

In operations, in various embodiments which the capacitive units 551 and 552 are included in the feedback circuit 550, the capacitive unit 551 couples the current signal I3 to the node V1, and the capacitive unit 552 couples the current signal I1 to the node V1. Simultaneously, the divided signal of the output signal at the output node Vout is also provided at the node V1, by the divided resistors Rfb1 and Rfb2. The signal at the node V1 is coupled to the gate of the transistor M1 of the operational amplifier 510, which is indicated as the feedback signal VFB. Alternatively stated, the feedback signal VFB coupled from the feedback circuit 550 includes the signal coupled from at least one of the capacitive units 551 and 552, and the divided signal coupled from the output terminal of the LDO regulator 500 (i.e., the output node Vout). Therefore, the feedback signal VFB coupled from the feedback circuit 550 includes the ripple signal at least in the output signal from the LDO regulator 500 or in the supply voltage signal VDD. To explain in another way, the current signal I3 is coupled through the capacitive unit 551 to the input terminal of the operational amplifier 510, which is referred as the gate of the transistor M1. Also, the current signal I1 is coupled through the capacitive unit 552 to the input terminal of the operational amplifier 510, which is referred as the gate of the transistor M1.

Compared to the approach without feedback circuit or output circuit, which has been described above in FIG. 3, in the present disclosure, with reference to FIG. 5, at least one feedback path is provided to cancel the ripple signal, including the feedback signal VFB coupled to one input terminal of the operational amplifier 510.

Moreover, the output circuit 520 is included in the LDO regulator 500, and is configured to provide the output signal, including the current signal I1, to the feedback circuit 550. Furthermore, the feedback circuit 550 is also included in the LDO regulator 500, and is configured to couple the feedback signals, for example, including the current signal I1 from the output circuit 520 and the current signal I3 from the output terminal of the LDO regulator 500, to the operational amplifier 510.

Therefore, the amplified signal is generated, under the operations including, for example, eliminating the feedback signal VFB from including the feedback circuit 550 and the divided resistors, by the operational amplifier 510. Accordingly, the signal outputted from the LDO regulator 500 does not affected by the ripple signal in the power supply A1. In this situation, when the LDO regulator 500 is applied in the SOC, the signal outputted from the LDO regulator 500 has good PSRR, which would lead to good performance for operating the load.

Reference is now made to FIG. 4. With reference to FIGS. 4-5, in some embodiments, the signal outputted from the operational amplifier 510 corresponds to a block 410 in FIG. 4, which indicates the suppression ability contributed by the operational amplifier 510. Alternatively stated, the operational amplifier 510 focuses on the suppressing the ripple signal at low frequency bandwidth.

With reference to FIGS. 4-5, in some embodiments, the signal outputted from the feedback circuit 550 corresponds to a block 430 in FIG. 4, which indicates the suppression ability contributed by the feedback circuit 550. Alternatively stated, the feedback circuit 550 focuses on the suppressing the ripple signal at high frequency bandwidth.

FIG. 6 is a circuit diagram of LDO regulator 600 associated with at least one of the LDO regulator 110 shown in FIG. 1, the LDO regulator 210 shown in FIG. 2, the LDO regulator 300 shown in FIG. 3, or the LDO regulator 500 shown in FIG. 5, in accordance with some embodiments of the present disclosure.

For illustration in FIG. 6, the LDO regulator 600 is coupled between a power supply A1 and a capacitor $C_L$, which is also coupled to the load (which is shown in FIGS. 1-2). Specifically, an input of the LDO regulator 600 is coupled to the power supply A1, and an output of the LDO regulator 600. The output of the LDO regulator 600 is indicated as an output node Vout, and is coupled to the capacitor $C_L$ and the load, including, for example, the load 120 of FIG. 1 and the load 220 of FIG. 2.

The LDO regulator 600 is configured to generate the signal to the load with stable voltage within the specific dropout voltage, in response to supply signals generated from the power supply A1 and feedback signals which will be discussed below.

In some embodiments, the power supply A1 and the capacitor $C_L$ shown in FIG. 6 corresponds to the power supply A1 and the capacitor $C_L$ shown in FIGS. 3 and 5, respectively. With respect to the embodiments of FIGS. 3 and 5, like elements in FIG. 6 are designated with the same reference numbers for ease of understanding.

The LDO regulator 600 includes an operational amplifier 610, an output circuit 620, a feedback circuit 630, a compensation circuit 640, a feedback circuit 650, and divided resistors Rfb1 and Rfb2.

In some embodiments, the operational amplifier 610 shown in FIG. 6 corresponds to the operational amplifier 211 shown in FIG. 2, the output circuit 620 shown in FIG. 6 corresponds to the output circuit 212 shown in FIG. 2, and the feedback circuit 650 shown in FIG. 6 corresponds to the feedback circuit 213 shown in FIG. 2.

In some embodiments, the operational amplifier 610 shown in FIG. 6 corresponds to at least one of the operational amplifier 310 shown in FIG. 3 or the operational amplifier 510 shown in FIG. 5. The output circuit 620 shown in FIG. 6 corresponds to at least one of the output circuit 320 shown in FIG. 3, or the output circuit 520 shown in FIG. 5. The feedback circuit 630 shown in FIG. 6 corresponds to the feedback circuit 330 shown in FIG. 3. The compensation circuit 640 shown in FIG. 6 corresponds to at least one of the compensation circuit 340 shown in FIG. 3 or the compensation circuit 540 shown in FIG. 5. The feedback circuit 650 shown in FIG. 6 corresponds to the feedback circuit 550 shown in FIG. 5. The divided resistors Rfb1 and Rfb2 shown in FIG. 6 correspond to the divided resistors Rfb1 and Rfb2 shown in FIGS. 3 and 5. With respect to the embodiments of FIGS. 1-3 and 5, like elements in FIG. 6 are designated with the similar reference numbers for ease of understanding.

Compared to the embodiments illustrated in FIG. 3, the LDO regulator 600 further includes the feedback circuit 650. The feedback circuit 650 is coupled between the operational amplifier 610 and the output terminal of the LDO regulator 600 (i.e., the output node Vout). The feedback circuit 650 is also coupled between the operational amplifier 610 and the output circuit 520. The feedback circuit 650 is further coupled to the feedback circuit 630.

Compared to the embodiments illustrated in FIG. 5, the LDO regulator 600 further includes the feedback circuit 630. The feedback circuit 630 is coupled between the operational amplifier 610 and the output circuit 620. The feedback circuit 630 is further coupled to the feedback circuit 650.

In operations, in some embodiments, the operational amplifier 610 is configured to be driven by the power supply A1, and is configured to receive feedback signals, including, for example, the feedback signal from the feedback circuit 630, and the feedback signal VFB from the feedback circuit 650 and the divided resistors Rfb1 and Rfb2.

The operational amplifier 610 is further configured to output an amplified signal (not shown) to the output terminal of the operational amplifier 610 (i.e., the node Vop). In some embodiment, in the operation of outputting the amplified signal, the operational amplifier 610 eliminates the feedback signals coupled from the feedback circuit 630 and the feedback circuit 650.

Alternatively stated, in operations, according to some embodiments of the present disclosure, the feedback signal coupled from the feedback circuit 630 includes the signal coupled from the capacitive unit 632 and the current mirror unit 631. Therefore, the feedback signal coupled from the feedback circuit 630 includes the amplified ripple signal in the supply voltage signal VDD.

Furthermore, in operations, according to some embodiments of the present disclosure, the feedback signal VFB coupled from the feedback circuit 650 includes the signal coupled from at least one of the capacitive units 651 and 652, and the divided signal coupled from the output terminal of the LDO regulator 600 (i.e., the output node Vout). Therefore, the feedback signal VFB coupled from the feedback circuit 650 includes the ripple signal at least in the output signal from the LDO regulator 600 or in the supply voltage signal VDD.

Compared to the approach without feedback circuit or output circuit, which has been described above in FIG. 3, in the present disclosure, with reference to FIG. 6, at least one feedback path is provided to cancel the ripple signal, including the feedback signal (i.e., the current signal I2) coupled to one input terminal of the operational amplifier 610, and the feedback signal VFB coupled to another input terminal of the operational amplifier 610.

Moreover, the output circuit 620 is included in the LDO regulator 600, and is configured to provide the output signal, including the current signal I1, to the feedback circuits 630 and 650. Furthermore, the feedback circuit 630 is also included in the LDO regulator 600, and is configured to couple the feedback signals, for example, including the current signal I2 from the feedback circuit 630, to the operational amplifier 610. In addition, the feedback circuit 650 is also included in the LDO regulator 600, and is configured to couple the feedback signals, for example, including the current signal I1 from the output circuit 620 and the current signal I3 from the output terminal of the LDO regulator 600, to the operational amplifier 610.

Therefore, the amplified signal is generated, under the operations, including, for example, eliminating the feedback signal (i.e., the current signal I2) coupled from the feedback circuit 630 and the feedback signal VFB, including the signals coupled from including the feedback circuit 650 and the divided resistors, by the operational amplifier 610. Accordingly, the signal outputted from the LDO regulator 600 does not affected by the ripple signal in the output terminal of the LDO regulator 600 and the ripple signal in the power supply A1. In this situation, when the LDO regulator 600 is applied in the SOC, the signal outputted from the LDO regulator 600 has good PSRR, which would lead to good performance for operating the load.

Reference is now made to FIG. 4. With reference to FIGS. 4 and 6, in some embodiments, the signal outputted from the operational amplifier 610 corresponds to a block 410 in FIG. 4, which indicates the suppression ability contributed by the operational amplifier 610. Alternatively stated, the operational amplifier 610 focuses on the suppressing the ripple signal at low frequency bandwidth.

With reference to FIGS. 4 and 6, in some embodiments, the signal outputted from the feedback circuit 650 corresponds to a block 430 in FIG. 4, which indicates the suppression ability contributed by the feedback circuit 550. Alternatively stated, the feedback circuit 650 focuses on the suppressing the ripple signal at high frequency bandwidth.

Figure 7:
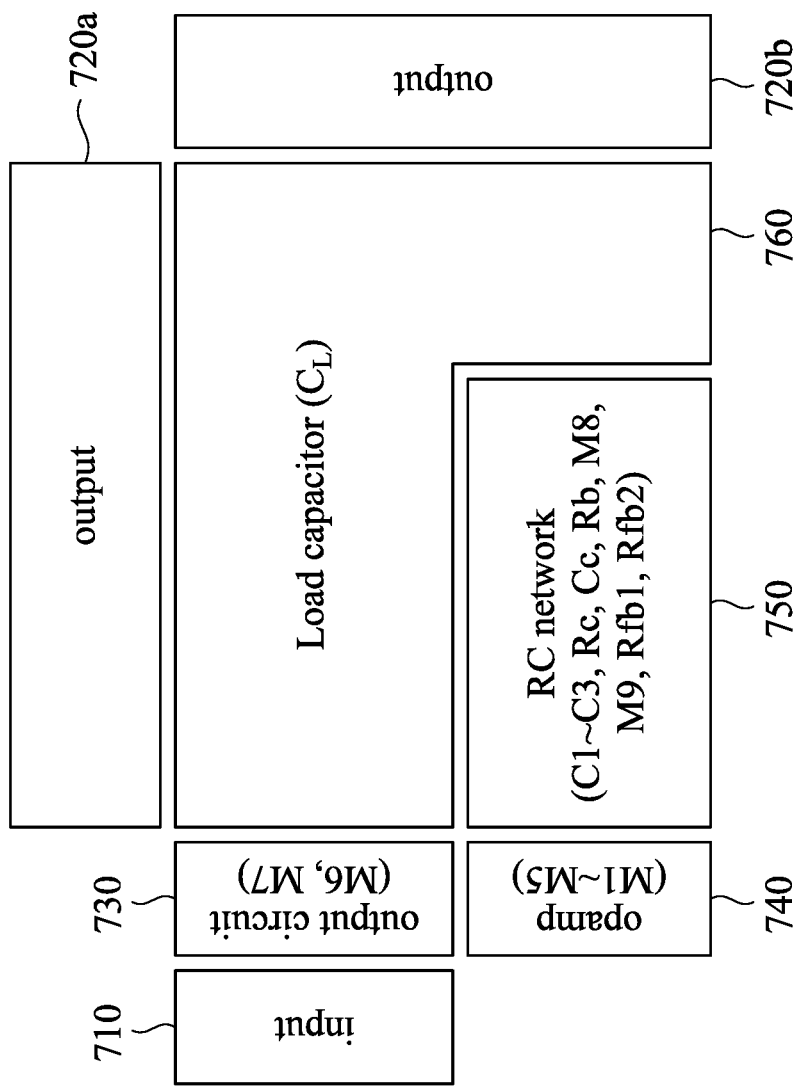
FIG. 7 is a layout diagram of a circuit corresponding to the LDO regulator shown in FIG. 6 in plan view, in accordance with some embodiments of the present disclosure.

FIG. 7 is a layout diagram 700 of a circuit associated with the LDO regulator 600 shown in FIG. 6 in plan view, in accordance with some embodiments of the present disclosure. The layout diagram 700 is an exemplary diagram of layout floorplan of LDO regulator, for example, the LDO regulator 600 in FIG. 6.

For illustration in FIG. 7, the layout diagram 700 includes an input block 710, output blocks 720a, 720b, an output circuit block 730, an operational operator (opamp) block 740, a RC network block 750, and a load capacitor block 760. For simplicity, each one of the output blocks 720a, 720b is referenced as 720 hereinafter for illustration, because each one of the output blocks 720a, 720b operates in a similar way in some embodiments.

The output circuit block 730, the operational operator block 740, the RC network block 750, and the load capacitor block 760 are arranged surrounded by the input block 710 and the output blocks 720, and are configured as the LDO regulator.

With reference to FIGS. 5 and 7, in some embodiments, the output circuit block 730 corresponds to the output circuit 620 shown in FIG. 6, for arrangement of the transistors M6-M7.

The output circuit block 730 is arranged as a rectangle, in order to enlarge total metal width from the input block 710, through the transistors M6-M7, to output the output signal (i.e., the current signal I1 shown in FIG. 6) with high load current.

The operational operator block 740 corresponds to the operational amplifier 610 shown in FIG. 6, for arrangement of the transistors M1-M5.

In the operational operator block 740, the parasitic capacitor between metal track of the gate and the drain of the transistor M1 is reduced, by avoiding their metal tracks being placed adjacently, in order to reduce the coupling signal from the gate the transistor M1, through the parasitic capacitor, to the drain of the transistor M1.

Similarly, in the operational operator block 740, the parasitic capacitor between metal track of the gate of the transistor M1 and the gate of the transistor M2 is reduced, by avoiding their metal tracks being placed adjacently, in order to reduce the coupling signal from the gate the transistor M1, through the parasitic capacitor, to the gate of the transistor M2.

The RC network block 750 corresponds to circuits including the feedback circuit 630, the compensation circuit 640, the feedback circuit 650, and divided resistors Rfb1 and Rfb2 shown in FIG. 6., for arrangement of the transistors M8-M9, the capacitors C1-C3 and Cc, and the resistors Rc, Rb, Rfb1 and Rfb2.

In the RC network block 750, the capacitors and the resistors are arranged as a capacitor and resistor array, with at least one of dummy capacitor or resistor, in order to implement the transistors M8-M9, the capacitors C1-C3 and Cc, and the resistors Rc, Rb, Rfb1 and Rfb2, and to reduce the variation of these components.

The load capacitor block 760 corresponds to the capacitor $C_L$ shown in FIG. 6, for arrangement of the capacitor $C_L$.

The load capacitor block 760 is arranged as L-shaped, in order to have multiple output directions to, including, for example, the output blocks 720a and 720b, which may enhance the electromigration (EM) and the voltage dropped on the metal tracks.

The layout diagram 700 provided in some embodiments of the present disclosure may have less resistance-capacitance (RC) variation and reduce the metal tracks induced by the parasitic capacitor to the operational amplifier.

Figure 8:
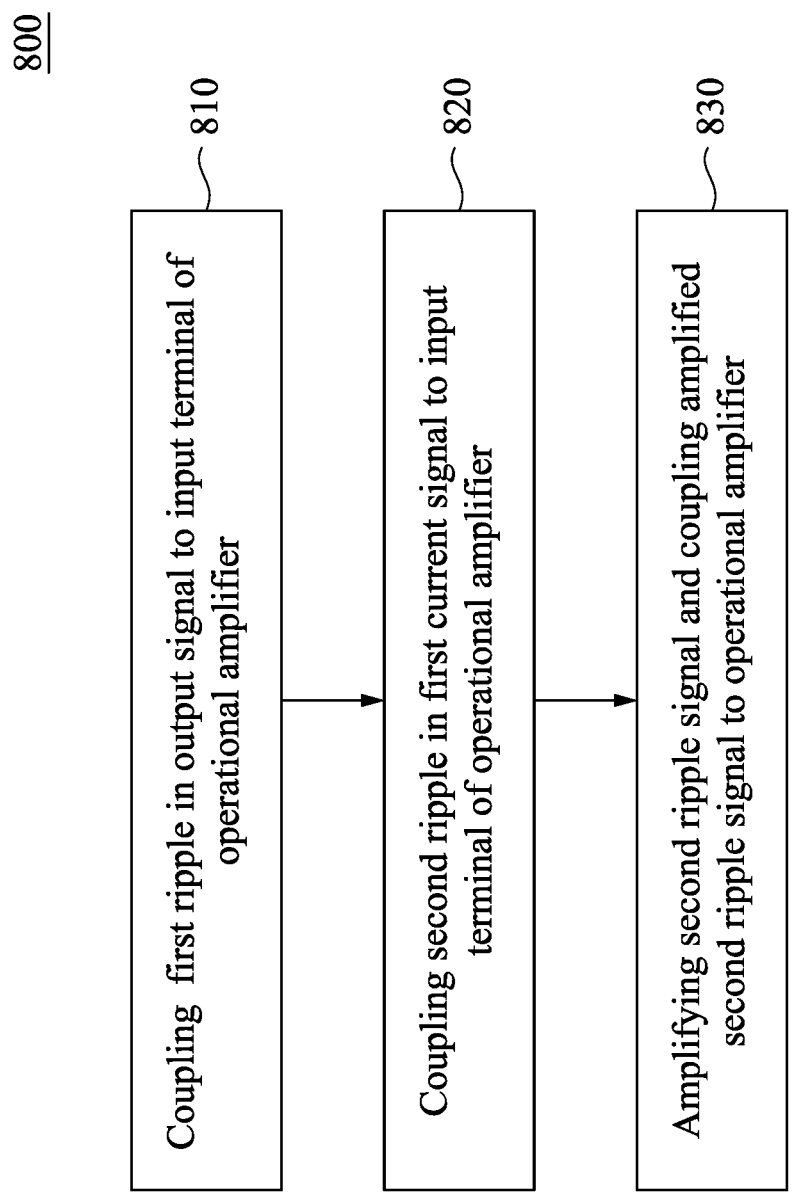
FIG. 8 is a block diagram of a circuit, in accordance with some embodiments of the present disclosure.

FIG. 8 is a block diagram 800 of a circuit, in accordance with some embodiments of the present disclosure. For illustration in FIG. 8, the block diagram 800 includes operations 810, 820, and 830. The block diagram 800 is performed to execute an LDO regulator which is associated with the LDO regulator shown in at least one of FIGS. 1-6. Following illustrations of the block diagram 800 in FIG. 8 with reference to the LDO regulator 600 in FIG. 6 include exemplary operations. However, the operations in FIG. 8 are not necessarily performed in the order shown. Alternatively stated, operations may be added, replaced, changed order, and/or eliminated as appropriate, in accordance with the spirit and scope of various embodiments of the present disclosure.

In operation 810, first ripple signal in an output signal generated by an output circuit that is coupled to an output terminal of an operational amplifier is coupled to an input terminal of the operational amplifier that is configured to receive the feedback signal.

With reference to FIGS. 6 and 8, in some embodiments, the output circuit corresponds to the output circuit 620 shown in FIG. 6. In some embodiments, the operational amplifier corresponds to the operational amplifier 610 shown in FIG. 6, and the output terminal of the operational amplifier corresponds to the node Vop shown in FIG. 6. In some embodiments, the output signal corresponds to the output signal outputted from the LDO regulator 600 described in FIG. 6, and the first ripple signal in the output signal corresponds to the ripple signal in the output signal at the output node Vout described in FIG. 6 In some embodiments, the feedback signal corresponds to the feedback signal VFB shown in FIG. 6.

In operation 820, second ripple signal in a first current signal generated by the output circuit is coupled to the input terminal of the operational amplifier.

With reference to FIGS. 6 and 8, in some embodiments, the first current signal corresponds to the current signal I1 shown in FIG. 6, and second ripple signal in the first current signal corresponds to the ripple signal in the current signal I1, which is also indicated as the ripple signal in the supply voltage signal VDD described in FIG. 6.

In operation 830, the second ripple signal is amplified, and the amplified second ripple signal is coupled to the operational amplifier.

With reference to FIGS. 6 and 8, in some embodiments, the amplified second ripple signal corresponds to the amplified ripple signal in the current signal I1, which is also indicated as the ripple signal in the current signal I2 described in FIG. 6.

Moreover, various circuits or devices to implement the transistors in the aforementioned embodiments are within the contemplated scope of the present disclosure.

In some embodiments, the transistors in the aforementioned embodiments, including the transistors M1-M9, and Mb, are implemented by core type metal oxide semiconductor (MOS) transistor, in order to have wide frequency bandwidth and strong driving capability. In various embodiments, at least one of the transistors M1-M9, or Mb is implemented by IO driving type MOS transistor.

Furthermore, in some embodiments of this document, at least one of the transistors is implemented with at least one MOS transistor, at least one bipolar junction transistor (BJT), etc., or the combination thereof. Various circuits or devices to implement the transistors in the aforementioned embodiments are within the contemplated scope of the present disclosure.

In some embodiments, a device is disclosed. The device includes an operational amplifier, an output circuit, a first capacitor, and a second capacitor. The operational amplifier is configured to generate an output according to a feedback signal. The output circuit is configured to generate a first current signal in response to a supply voltage and the output of the operational amplifier. The first current signal includes a first ripple signal. The first capacitor and the second capacitor are coupled in parallel between the operational amplifier and the output circuit. The first capacitor is configured to receive the first current signal and feedback to the operational amplifier the first ripple signal.

In some embodiments, the second capacitor is configured to receive a second current signal including a second ripple signal and feedback to the operational amplifier the second ripple signal. The second ripple signal is different from the first ripple signal.

In some embodiments, the device of claim 1, further includes a current mirror unit coupled between the first capacitor and the operational amplifier and configured to receive the first current signal.

In some embodiments, the current mirror unit includes a first transistor and a second transistor. A control terminal of the first transistor and a first terminal of the first transistor are coupled together to the first capacitor. A control terminal of the second transistor is coupled to the first terminal of the first transistor and the control terminal of the first transistor.

In some embodiments, the control terminal of the first transistor and the first terminal of the first transistor and the control terminal of the second transistor are coupled to the output circuit and are configured to receive the first current signal from the output circuit.

In some embodiments, the current mirror unit further includes a resistor. A first terminal of the resistor is coupled to a first terminal of the second transistor, and a second terminal of the resistor is configured to receive the supply voltage.

In some embodiments, the first transistor is configured to mirror the first current signal to the second transistor, and the second transistor is configured to generate an amplified current signal from the first current signal based on the resistor.

In some embodiments, the device further includes a third capacitor. A first terminal of the third capacitor is coupled to the first terminal of the resistor and the first terminal of the second transistor, and a second terminal of the third capacitor is coupled to the operational amplifier.

In some embodiments, the amplified current signal includes a second ripple signal, and the third capacitor is configured to feedback the second ripple signal to the operational amplifier.

In some embodiments, a device is disclosed. The device includes an operational amplifier, an output circuit, a first capacitor and a second capacitor, a current mirror unit, and a third capacitor. The output circuit is configured to generate a first ripple signal in response to a supply voltage and an output of the operational amplifier. The first capacitor and the second capacitor are coupled in parallel between the operational amplifier and the output circuit. The first capacitor is configured to receive the first ripple signal. The current mirror unit is coupled between the operational amplifier and the output circuit. The current mirror unit is configured to amplify the first ripple signal as a second ripple signal. The third capacitor is configured to feedback the second ripple signal to the operational amplifier.

In some embodiments, the output circuit includes a first transistor and a second transistor. A first terminal of the first transistor and a first terminal of the second transistor are coupled together to receive the supply voltage, a control terminal of the first transistor and a control terminal of the second transistor are coupled together to the operational amplifier, a second terminal of the first transistor is coupled to the first capacitor, and a second terminal of the second transistor is coupled to the second capacitor.

In some embodiments, the device further includes a compensation circuit. The compensation circuit is configured to receive the output of the operational amplifier. The compensation circuit includes a fourth capacitor and a resistor coupled in series, the resistor is coupled to operational amplifier, the first transistor and, the second transistor, and the fourth capacitor is coupled to the second transistor and the second capacitor.

In some embodiments, the current mirror unit includes a first transistor and a second transistor. A control terminal of the first transistor and a first terminal of the first transistor and a control terminal of the second transistor are configured to receive the first ripple signal.

In some embodiments, the current mirror unit further includes a resistor coupled to a first terminal of the second transistor. The first transistor is configured to mirror the first ripple signal to the second transistor, and the second transistor is configured to generate the second ripple signal from the first ripple signal based on the resistor.

In some embodiments, the resistor and the first terminal of the second transistor are coupled to the third capacitor, and the second transistor is configured to mirror the second ripple signal to the third capacitor.

In some embodiments, a method is disclosed. The method includes: generating a first ripple signal based on a ripple signal included in a supply voltage signal; coupling the first ripple signal to a first input terminal of an operational amplifier; amplifying the first ripple signal as a second ripple signal; coupling the second ripple signal to a second input terminal of the operational amplifier, the second input terminal being different from the first input terminal; and generating, by the operational amplifier, an output in response to the first ripple signal and the second ripple signal, for generating an output voltage.

In some embodiments, the method further includes: generating a third ripple signal in response to the supply voltage signal and the output; and coupling the third ripple signal to the first input terminal of the operational amplifier.

In some embodiments, coupling the first ripple signal comprises coupling, by a first capacitor, the first ripple signal to the first input terminal. Coupling the second ripple signal comprises coupling, by a second capacitor, the second ripple signal to the second input terminal. Coupling the third ripple signal comprises coupling, by a third capacitor, the third ripple signal to the first input terminal. The first, second, and third capacitors are different from each other.

In some embodiments, the method further includes: transmitting the first ripple signal to the first capacitor and a current mirror unit, wherein the current mirror unit is coupled between the first capacitor and the second capacitor.

In some embodiments, the method further includes: mirroring, by a current mirror unit, the first ripple signal before amplifying the first ripple signal as the second ripple signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   an operational amplifier configured to generate an output according to a feedback signal;
   an output circuit configured to generate a first current signal in response to a supply voltage and the output of the operational amplifier, wherein the first current signal includes a first ripple signal; and
   a first capacitor and a second capacitor coupled in parallel between the operational amplifier and the output circuit, wherein the first capacitor is configured to receive the first current signal and feedback to the operational amplifier the first ripple signal.

2. The device of claim 1, wherein the second capacitor is configured to receive a second current signal including a second ripple signal and feedback to the operational amplifier the second ripple signal, the second ripple signal being different from the first ripple signal.

3. The device of claim 1, further comprising:
   a current mirror unit coupled between the first capacitor and the operational amplifier and configured to receive the first current signal.

4. The device of claim 3, wherein the current mirror unit comprises:
   a first transistor, wherein a control terminal of the first transistor and a first terminal of the first transistor are coupled together to the first capacitor; and
   a second transistor, wherein a control terminal of the second transistor is coupled to the first terminal of the first transistor and the control terminal of the first transistor.

5. The device of claim 4, wherein the control terminal of the first transistor and the first terminal of the first transistor and the control terminal of the second transistor are coupled to the output circuit and are configured to receive the first current signal from the output circuit.

6. The device of claim 4, wherein the current mirror unit further comprises:
   a resistor, wherein a first terminal of the resistor is coupled to a first terminal of the second transistor, and a second terminal of the resistor is configured to receive the supply voltage.

7. The device of claim 6, wherein the first transistor is configured to mirror the first current signal to the second transistor, and the second transistor is configured to generate an amplified current signal from the first current signal based on the resistor.

8. The device of claim 7, further comprising:
   a third capacitor, wherein a first terminal of the third capacitor is coupled to the first terminal of the resistor and the first terminal of the second transistor, and a second terminal of the third capacitor is coupled to the operational amplifier.

9. The device of claim 8, wherein the amplified current signal includes a second ripple signal, and the third capacitor is configured to feedback the second ripple signal to the operational amplifier.

10. A device, comprising:
    an operational amplifier;
    an output circuit configured to generate a first ripple signal in response to a supply voltage and an output of the operational amplifier;
    a first capacitor and a second capacitor coupled in parallel between the operational amplifier and the output circuit, wherein the first capacitor is configured to receive the first ripple signal;
    a current mirror unit coupled between the operational amplifier and the output circuit, wherein the current mirror unit is configured to amplify the first ripple signal as a second ripple signal; and
    a third capacitor configured to feedback the second ripple signal to the operational amplifier.

11. The device of claim 10, wherein the output circuit comprises:
    a first transistor and a second transistor, wherein a first terminal of the first transistor and a first terminal of the second transistor are coupled together to receive the supply voltage, a control terminal of the first transistor and a control terminal of the second transistor are coupled together to the operational amplifier, a second terminal of the first transistor is coupled to the first capacitor, and a second terminal of the second transistor is coupled to the second capacitor.

12. The device of claim 11, further comprising:
    a compensation circuit configured to receive the output of the operational amplifier, wherein the compensation circuit comprises a fourth capacitor and a resistor coupled in series, the resistor is coupled to operational amplifier, the first transistor and, the second transistor, and the fourth capacitor is coupled to the second transistor and the second capacitor.

13. The device of claim 10, wherein the current mirror unit comprises:
    a first transistor and a second transistor, wherein a control terminal of the first transistor and a first terminal of the first transistor and a control terminal of the second transistor are configured to receive the first ripple signal.

14. The device of claim 13, wherein the current mirror unit further comprises:
    a resistor coupled to a first terminal of the second transistor;
    wherein the first transistor is configured to mirror the first ripple signal to the second transistor, and the second transistor is configured to generate the second ripple signal from the first ripple signal based on the resistor.

15. The device of claim 14, wherein the resistor and the first terminal of the second transistor are coupled to the third capacitor, and the second transistor is configured to mirror the second ripple signal to the third capacitor.

16. A method, comprising:
    generating a first ripple signal based on a ripple signal included in a supply voltage signal;
    coupling the first ripple signal to a first input terminal of an operational amplifier;
    amplifying the first ripple signal as a second ripple signal;
    coupling the second ripple signal to a second input terminal of the operational amplifier, the second input terminal being different from the first input terminal; and
    generating, by the operational amplifier, an output in response to the first ripple signal and the second ripple signal, for generating an output voltage.

17. The method of claim 16, further comprising:
    generating a third ripple signal in response to the supply voltage signal and the output; and
    coupling the third ripple signal to the first input terminal of the operational amplifier.

18. The method of claim 17, wherein coupling the first ripple signal comprises coupling, by a first capacitor, the first ripple signal to the first input terminal;

wherein coupling the second ripple signal comprises coupling, by a second capacitor, the second ripple signal to the second input terminal;

wherein coupling the third ripple signal comprises coupling, by a third capacitor, the third ripple signal to the first input terminal;

wherein the first, second, and third capacitors are different from each other.

19. The method of claim 18, further comprising:

transmitting the first ripple signal to the first capacitor and a current mirror unit, wherein the current mirror unit is coupled between the first capacitor and the second capacitor.

20. The method of claim 16, further comprising:

mirroring, by a current mirror unit, the first ripple signal before amplifying the first ripple signal as the second ripple signal.

* * * * *